US012456611B2

(12) United States Patent
Dorf et al.

(10) Patent No.: US 12,456,611 B2
(45) Date of Patent: Oct. 28, 2025

(54) SYSTEMS AND METHODS FOR CONTROLLING A VOLTAGE WAVEFORM AT A SUBSTRATE DURING PLASMA PROCESSING

(71) Applicant: APPLIED MATERIALS, INC., Santa Clara, CA (US)

(72) Inventors: Leonid Dorf, San Jose, CA (US); James Hugh Rogers, Los Gatos, CA (US); Olivier Luere, Sunnyvale, CA (US); Travis Koh, Sunnyvale, CA (US); Rajinder Dhindsa, Pleasanton, CA (US); Sunil Srinivasan, Milpitas, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 844 days.

(21) Appl. No.: 15/618,082

(22) Filed: Jun. 8, 2017

(65) Prior Publication Data

US 2017/0358431 A1 Dec. 14, 2017

Related U.S. Application Data

(60) Provisional application No. 62/349,383, filed on Jun. 13, 2016.

(51) Int. Cl.
*H01J 37/32* (2006.01)

(52) U.S. Cl.
CPC .. *H01J 37/32706* (2013.01); *H01J 37/32146* (2013.01); *H01J 37/32715* (2013.01); (Continued)

(58) Field of Classification Search
USPC ............ 156/345.43, 345.47; 118/723 E, 723
See application file for complete search history.

(56) References Cited

U.S. PATENT DOCUMENTS 4,622,094 A * 11/1986 Otsubo ............ H01J 37/32706 204/192.32
5,418,821 A 5/1995 Tran
(Continued)

FOREIGN PATENT DOCUMENTS

CN 104756238 A 7/2015
JP H06-232088 8/1994
(Continued)

OTHER PUBLICATIONS

Search Report for Application CN 2017800364692, dated Apr. 2, 2020.
Search Report for CN2017800364692, dated Oct. 12, 2021.

*Primary Examiner* — Ram N Kackar
(74) *Attorney, Agent, or Firm* — Moser Taboada

(57) ABSTRACT

Systems and methods for controlling a voltage waveform at a substrate during plasma processing include applying a shaped pulse bias waveform to a substrate support, the substrate support including an electrostatic chuck, a chucking pole, a substrate support surface and an electrode separated from the substrate support surface by a layer of dielectric material. The systems and methods further include capturing a voltage representative of a voltage at a substrate positioned on the substrate support surface and iteratively adjusting the shaped pulse bias waveform based on the captured signal. In a plasma processing system a thickness and a composition of a layer of dielectric material separating the electrode and the substrate support surface can be selected such that a capacitance between the electrode and the substrate support surface is at least an order of magnitude greater than a capacitance between the substrate support surface and a plasma surface.

13 Claims, 8 Drawing Sheets

(52) U.S. Cl.
CPC .... *H01J 37/32935* (2013.01); *H01J 37/3299* (2013.01); *H01J 2237/334* (2013.01)

(56) References Cited

U.S. PATENT DOCUMENTS

| | | | | |
|---|---|---|---|---|
| 5,665,166 | A * | 9/1997 | Deguchi | C23C 16/5096 118/723 E |
| 5,870,271 | A * | 2/1999 | Herchen | H02N 13/00 361/234 |
| 6,201,208 | B1 * | 3/2001 | Wendt | B23K 10/003 219/121.41 |
| 9,536,749 | B2 | 1/2017 | Marakhtanov et al. | |
| 9,659,757 | B2 | 5/2017 | Kuthi et al. | |
| 2002/0007911 | A1 * | 1/2002 | Kuibira | C04B 37/005 156/345.12 |
| 2005/0081999 | A1 * | 4/2005 | Yasui | H01J 37/3266 156/345.28 |
| 2005/0152089 | A1 * | 7/2005 | Matsuda | H02N 13/00 361/234 |
| 2005/0191830 | A1 * | 9/2005 | Collins | H01J 37/32082 438/514 |
| 2007/0146961 | A1 * | 6/2007 | Morioka | H02N 13/00 361/234 |
| 2007/0223167 | A1 * | 9/2007 | Hattori | C04B 35/101 361/118 |
| 2010/0142113 | A1 * | 6/2010 | Lee | H01L 21/6831 361/234 |
| 2010/0243609 | A1 | 9/2010 | Yamazawa et al. | |
| 2011/0043228 | A1 | 2/2011 | Makhratchev et al. | |
| 2012/0000421 | A1 | 1/2012 | Miller et al. | |
| 2012/0052599 | A1 | 3/2012 | Brouk et al. | |
| 2012/0318456 | A1 * | 12/2012 | Brouk | H01J 37/32009 156/345.28 |
| 2013/0277333 | A1 | 10/2013 | Misra et al. | |
| 2014/0027059 | A1 | 1/2014 | Honda et al. | |
| 2014/0060572 | A1 | 3/2014 | Yasumuro et al. | |
| 2014/0062495 | A1 | 3/2014 | Carter et al. | |
| 2015/0284838 | A1 | 10/2015 | Marx et al. | |
| 2016/0020072 | A1 | 1/2016 | Brouk et al. | |
| 2016/0020075 | A1 | 1/2016 | Lemson | |
| 2016/0064260 | A1 | 3/2016 | Berry, III et al. | |
| 2016/0091534 | A1 | 3/2016 | Emma et al. | |
| 2016/0163514 | A1 | 6/2016 | Fisk, II et al. | |
| 2017/0057875 | A1 * | 3/2017 | Ishizuka | C04B 35/6261 |
| 2017/0057880 | A1 * | 3/2017 | Ahrendes | C04B 35/632 |
| 2017/0250056 | A1 | 8/2017 | Boswell et al. | |
| 2017/0358431 | A1 | 12/2017 | Dorf et al. | |
| 2019/0088517 | A1 * | 3/2019 | Kosakai | H01L 21/67103 |

FOREIGN PATENT DOCUMENTS

| | | | |
|---|---|---|---|
| JP | H09129621 | A | 9/1996 |
| JP | 2003077699 | A | 3/2003 |
| JP | 2004193564 | A | 7/2004 |
| JP | 2010027940 | A | 2/2010 |
| TW | 201419371 | A | 5/2014 |

* cited by examiner

SYSTEMS AND METHODS FOR CONTROLLING A VOLTAGE WAVEFORM AT A SUBSTRATE DURING PLASMA PROCESSING

CROSS-REFERENCE TO RELATED APPLICATIONS

This application claims benefit of Untied States provisional patent application Ser. No. 62/349,383, filed Jun. 13, 2016, which is herein incorporated by reference in its entirety.

FIELD

Embodiments of the present disclosure generally relate to systems and methods for plasma processing of a substrate and, particularly, to systems and methods for controlling a voltage waveform at a substrate during plasma processing of the substrate.

BACKGROUND

A typical Reactive Ion Etch (RIE) plasma processing chamber includes a radiofrequency (RF) bias generator, which supplies an RF voltage to a "power electrode", a metal baseplate embedded into the "electrostatic chuck" (ESC), more commonly referred to as the "cathode". FIG. 1A depicts a plot of a typical RF voltage to be supplied to a power electrode in a typical processing chamber. The power electrode is capacitively coupled to the plasma of a processing system through a layer of ceramic, which is a part of the ESC assembly. Non-linear, diode-like nature of the plasma sheath results in rectification of the applied RF field, such that a direct-current (DC) voltage drop, or "self-bias", appears between the cathode and the plasma. This voltage drop determines the average energy of the plasma ions accelerated towards the cathode, and thus the etch anisotropy.

More specifically, ion directionality, the feature profile, and selectivity to the mask and the stop-layer are controlled by the Ion Energy Distribution Function (IEDF). In plasmas with RF bias, the IEDF typically has two peaks, at low and high energy, and some ion population in between. FIG. 1B depicts a plot of a typical IEDF plotted as Ion Energy Distribution versus Ion energy. The presence of the ion population in between the two peaks of the IEDF as shown in FIG. 1B is reflective of the fact that the voltage drop between the cathode and the plasma oscillates at the bias frequency [FIG. 1A]. When a lower frequency, for example 2 MHZ, RF bias generator is used to get higher self-bias voltages, the difference in energy between these two peaks can be significant and the etch due to the ions at low energy peak is more isotropic, potentially leading to bowing of the feature walls. Compared to the high-energy ions, the low-energy ions are less effective at reaching the corners at the bottom of the feature (due to charging effect, for example), but cause less sputtering of the mask material. This is important in high aspect ratio etch applications, such as hard-mask opening.

As feature sizes continue to diminish and the aspect ratio increases, while feature profile control requirements get more stringent, it becomes more desirable to have a well-controlled IEDF at the substrate surface during processing. A single-peak IEDF can be used to construct any IEDF, including a two-peak IEDF with independently controlled peak heights and energies, which is very beneficial for high-precision plasma processing. Creating a single-peak IEDF requires having a nearly-constant voltage at the substrate surface with respect to plasma, i.e. the sheath voltage, which determines the ion energy. Assuming time-constant plasma potential (which is typically close to zero or a ground potential in processing plasmas), this requires maintaining a nearly constant voltage at the substrate with respect to ground, i.e. substrate voltage. This cannot be accomplished by simply applying a DC voltage to the power electrode, because of the ion current constantly charging the substrate surface. As a result, all of the applied DC voltage would drop across the substrate and the ceramic portion of the ESC (i.e., chuck capacitance) instead of the plasma sheath (i.e., sheath capacitance). To overcome this, a special shaped-pulse bias scheme has been developed that results in the applied voltage being divided between the chuck and the sheath capacitances (we neglect the voltage drop across the substrate, as the capacitance is usually much larger than the sheath capacitance). This scheme provides compensation for the ion current, allowing for the sheath voltage and the substrate voltage to remain constant for up to 90% of each bias voltage cycle. More accurately, this biasing scheme allows maintaining a specific substrate voltage waveform, which can be described as a periodic series of short positive pulses on top of the negative dc-offset. During each pulse, the substrate potential reaches the plasma potential and the sheath briefly collapses, but for ~90% of each cycle the sheath voltage remains constant and equal to the negative voltage jump at the end of each pulse, which thus determines the mean ion energy. FIG. 2A depicts a plot of a special shaped-pulse bias voltage waveform developed to create this specific substrate voltage waveform, and thus enable keeping the sheath voltage nearly constant. As depicted in FIG. 2A, the shaped-pulse bias waveform includes: (1) a positive jump 205 to remove the extra charge accumulated on the chuck capacitance during the compensation phase; (2) a negative jump 210 ($V_{OUT}$) to set the value of the sheath voltage ($V_{SH}$)—namely, $V_{OUT}$ gets divided between the chuck and sheath capacitors connected in series, and thus determines (but is generally larger than) the negative jump in the substrate voltage waveform; and (3) a negative voltage ramp 215 to compensate for ion current and keep the sheath voltage constant during this long "ion current compensation phase". The special shaped-pulse bias voltage waveform of FIG. 2A, when applied as a bias to a processing chamber, results in a single-peak IEDF as described above and as depicted in FIG. 2B.

The special shaped-pulse bias scheme, however, has certain shortcomings that limit the usefulness and complicate the use with commercial etch chambers. Specifically, for the ion current compensation to work, a shaped-pulse bias supply requires the knowledge of the value for ESC capacitance ($C_{CK}$) and stray capacitance ($C_{STR}$), with the latter being determined by the chamber conditions and therefore being sensitive to a large number of factors, such as thermal expansion of the parts etc. Furthermore, to correctly set the sheath voltage, the value of sheath capacitance ($C_{SH}$) needs to be known because the value of the negative jump, $V_{OUT}$, in the pulsed voltage waveform supplied to the power electrode is being divided between an ESC ceramic plate and the plasma sheath, as between two capacitors connected in series. The sheath capacitance is especially difficult to evaluate since the sheath capacitance depends on a large number of parameters, including chemical gas composition, RF source frequency and power (through plasma density and temperature), gas pressure, and material of the substrate being etched. Presently, full system calibration with sheath capacitance tabulation at a set of plasma conditions has to be performed prior to the actual processing. This method is not only time consuming and cumbersome, but also does not work accurately because the plasma is never perfectly reproducible. Creating a single-peak IEDF requires maintaining a predetermined voltage waveform at a substrate, in which a negative voltage jump represents the nearly constant sheath voltage and hence the mean ion energy. Due to the requirement of accurate determination of $C_{SH}$ and $C_{STR}$, the current shaped-pulse bias scheme is inefficient in real commercial etch chambers.

SUMMARY

Systems and methods for processing a substrate provide a well-controlled, single peak ion energy distribution function by maintaining a predetermined voltage waveform at a substrate during, for example, a plasma etching process. In accordance with various embodiments of the present principles a voltage waveform at a substrate is maintained by capturing a signal (i.e. measuring a voltage with respect to ground) representative (i.e. having the same waveform shape) of a voltage at a substrate being processed and iteratively adjusting a shaped pulse bias waveform being applied to a respective process chamber based on the captured signal. This is done until a desired pulsed voltage waveform of the captured signal (and therefore of the substrate voltage) is achieved. In some embodiments, the value of the negative jump at the end of each pulse is equal to the target ion energy, and the voltage between the pulses is constant. In some embodiments, a signal representative of a voltage at the substrate can be captured using a conductive lead in contact with the substrate. Alternatively or in addition, a capacitive circuit in proximity of the substrate can be used to capture a signal representative of a voltage at a substrate being processed (because all necessary information is contained in the shape of the captured pulsed waveform, and not in the dc-offset).

In other embodiments, a signal representative of a voltage at the substrate can be captured using a conductive lead in contact with a ring of conductive material surrounding the substrate. Alternatively or in addition, a capacitive circuit in proximity of the conductive ring can be used to capture a signal representative of a voltage at a substrate being processed.

In accordance with embodiments of the present principles, a target voltage waveform at a substrate is maintained by: (1) rendering a change in the voltage drop attributable to the chuck capacitance, $C_{CK}$, negligible by comparison with the change in the voltage drop attributable to the sheath capacitance, $C_{SH}$, during the negative jump (sheath formation) phase of the bias and substrate voltage waveforms, and (2) rendering the current through Cstr negligible by comparison with the current through $C_{CK}$ during the ion current compensation phase of the bias voltage waveform. This is accomplished by making a capacitance between a power electrode and a substrate much greater than sheath and stray capacitances, thus alleviating the requirement of the accurate determination. In some embodiments, this is achieved by selecting a thickness and a composition of a layer of dielectric material such that a capacitance of the dielectric layer between the electrode and the substrate support surface is at least an order of magnitude greater than a capacitance between the substrate surface and a plasma in a respective processing chamber. Because the change in the voltage drop across $C_{CK}$ is negligible compared to that across $C_{SH}$, the shape of the pulsed voltage waveform of the signal applied to the power electrode (i.e. bias voltage waveform) nearly reproduces the shape of the substrate voltage waveform during the negative jump phase. Thus, the electrode voltage waveform can be used as a signal representative of the substrate voltage waveform, as described in the embodiments above. That is, the negative jump in the electrode voltage waveform is almost equal to the negative jump in the substrate voltage waveform, and therefore can be used as a feedback signal to the shaped-pulse bias supply in order to achieve the target sheath voltage drop and ion energy.

Alternatively or in addition, to satisfy conditions (1) and (2) in paragraph above, the sheath capacitance, CH, and the stray capacitance, $C_{STR}$, are rendered negligible by comparison with the chuck capacitance, $C_{CK}$, by applying a voltage (bias) to a chucking electrode of an electrostatic chuck instead of to a power electrode. Note that in order for the shape of the bias voltage waveform to reproduce the shape of the substrate voltage waveform not only during sheath formation (negative jump, $V_{OUT}$) phase, but also during the ion current compensation phase, the change in the voltage drop across $C_{CK}$ due to ion current needs to be negligible compared to the bias voltage negative jump, $V_{OUT}$. It is expected to be the case in many practical situations (for typical ion currents used in processing), due to a very high capacitance between the chucking electrode and the substrate support surface. In what follows, the above methods and embodiments, as well as other possible embodiments, are described in greater detail.

In one embodiment, a method for controlling a voltage waveform at a substrate during plasma processing in a plasma processing chamber includes applying a shaped pulse bias waveform to a substrate support within the plasma processing chamber, the substrate support including an electrostatic chuck, a chucking pole, a substrate support surface and an electrode, capturing a signal representative of a voltage at a substrate positioned on the substrate support surface, and iteratively adjusting the shaped pulse bias waveform based on the captured signal.

In one embodiment, the signal representative of a voltage at the substrate is captured using a conductive lead in contact with at least a portion of the substrate. In another embodiment, the substrate support includes a ring of conductive material disposed above the electrode and the signal representative of a voltage at the substrate is captured using a conductive lead in contact with at least a portion of the ring of conductive material. In another embodiment, the signal representative of a voltage at the substrate is captured using a coupling circuit proximate the ring of conductive material or proximate the substrate.

In another embodiment in accordance with the present principles, a plasma processing system includes a substrate support defining a surface for supporting a substrate to be processed, the substrate support including an electrostatic chuck, a chucking pole, and an electrode, a sensor capturing a signal representative of a voltage at a substrate positioned on the substrate support surface, a bias supply providing a shaped pulse bias waveform to the substrate support, and a controller receiving the captured signal from the sensor and generating a control signal to be communicated to the bias supply to adjust the shaped pulse bias waveform based on the captured signal.

In one embodiment, the sensor includes a conductive lead in contact with at least a portion of the substrate. In another embodiment, the sensor includes a ring of conductive material disposed above the electrode. In another embodiment, the sensor includes a coupling circuit proximate the substrate.

In another embodiment, the system includes a conductive lead in contact with at least a portion of the ring of conductive material. In another embodiment, the system includes a coupling circuit proximate the ring of conductive material to deliver the captured signal to the controller.

In another embodiment, the shaped pulse bias waveform is applied to the electrode of the substrate support. In another embodiment, the shaped pulse bias waveform is applied to the chucking pole.

In one embodiment, a plasma processing system includes a substrate support, the substrate support including an electrostatic chuck, a chucking pole, and an electrode and defining a surface to support a substrate to be processed, wherein the electrode is separated from the substrate support surface by a layer of dielectric material. The system further includes a plasma, disposed above the substrate support surface, and a shaped pulse bias waveform generator to apply a shaped pulse bias waveform to the electrode, wherein a thickness and a composition of the layer of dielectric material is selected such that a capacitance of the dielectric layer between the electrode and the substrate support surface is at least an order of magnitude greater than a capacitance between the substrate support surface and the plasma.

In one embodiment, the dielectric layer comprises aluminum nitride having a thickness of about three to five millimeters. In at least one embodiment, the shaped pulse bias waveform is applied to the electrode of the substrate support and in another embodiment the shaped pulse bias waveform is applied to the chucking pole of the substrate support. In some embodiments, the plasma processing system includes a coupling circuit for coupling the shaped pulse bias waveform and a clamping voltage to the substrate support.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1A:
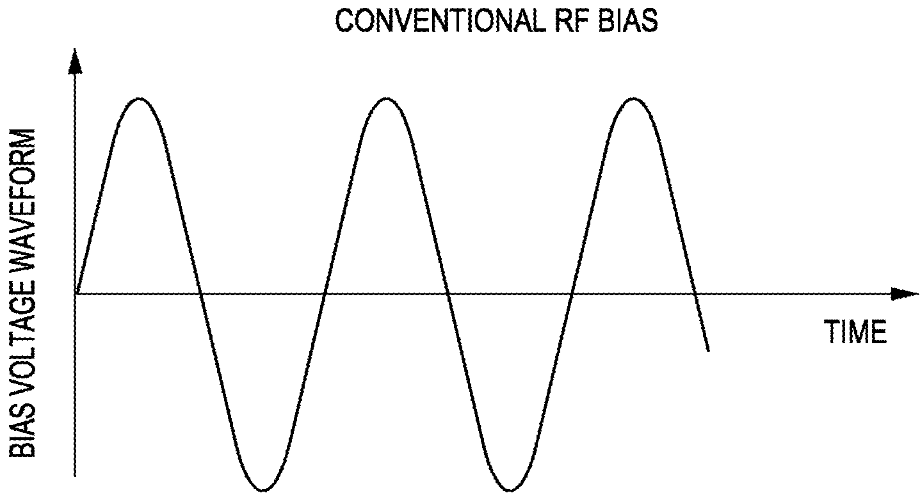
FIG. 1A depicts a plot of a typical RF voltage to be supplied to a power electrode in a typical processing chamber.
Figure 1B:
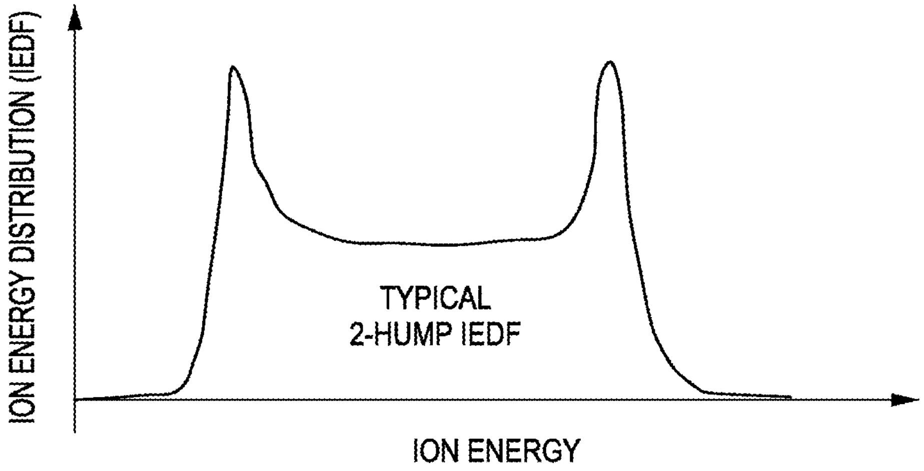
FIG. 1B depicts a plot of a typical Ion Energy Distribution Function resulting from RF bias being supplied to a processing chamber.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Systems and methods for controlling a voltage waveform at a substrate during plasma processing are provided herein. The inventive systems and methods advantageously provide a well-controlled, single peak ion energy distribution function by maintaining a predetermined voltage waveform at a substrate during, for example, a plasma etching process. Embodiments advantageously provide shaping of the voltage waveform to provide mono-energetic ions without the need for complex modeling or precise estimation of plasma sheath capacitance. Although embodiments of the present principles will be described primarily with respect to a specific shaped-pulse bias, embodiments in accordance with the present principles can be applied to and operate with substantially any bias.

Figure 3:
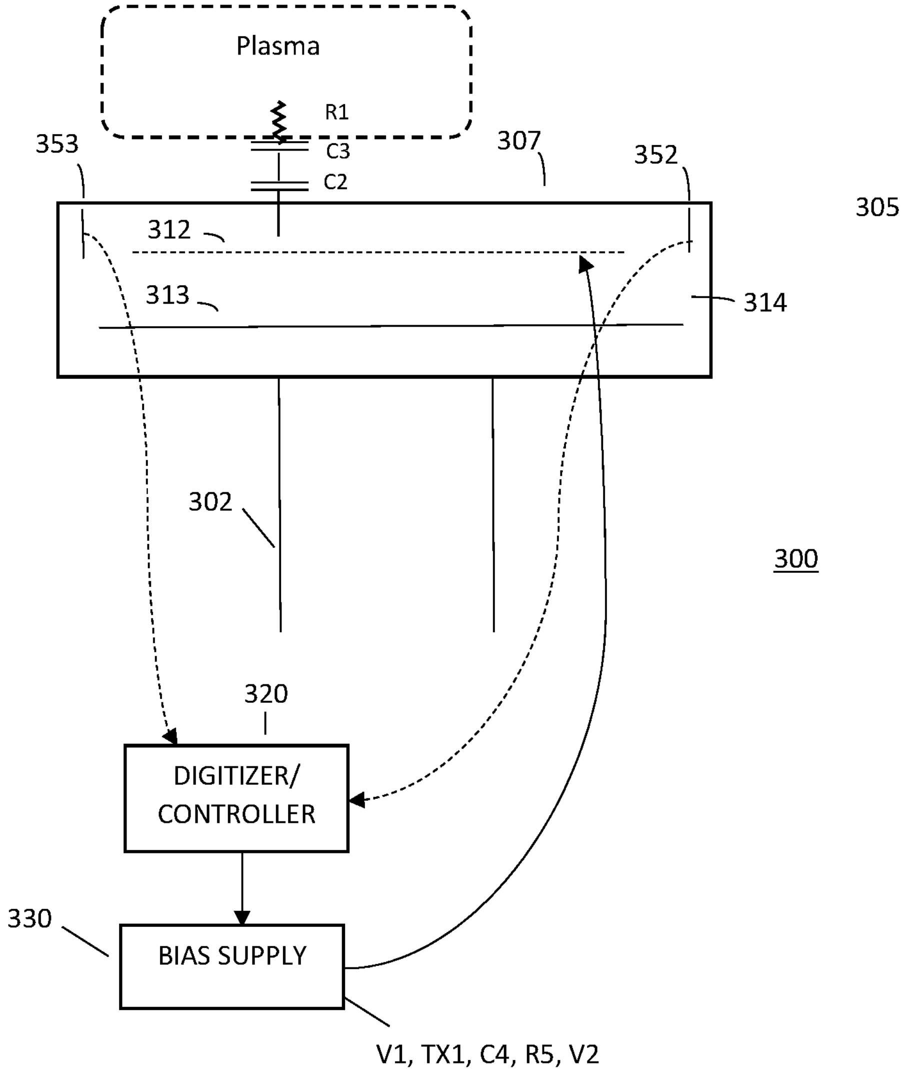
FIG. 3 depicts a high level schematic diagram of a system suitable for controlling a voltage waveform at a substrate during plasma processing in accordance with various embodiments of the present principles.

FIG. 3 depicts a high level schematic diagram of a system 300 suitable for use in the processing of a substrate in accordance with various embodiments of the present principles. The system 300 of FIG. 3 illustratively includes a substrate support assembly 305, a digitizer/controller 320 and a bias supply 330. In the embodiment of FIG. 3, the substrate support assembly 305 includes a support pedestal 302, an electrostatic chuck (ESC) 311, which includes a chucking electrode 312 (commonly referred to as a chucking pole), which can be a metal baseplate or mesh embedded into the ESC. The ESC has a substrate support surface 307. The chucking electrode 312 is typically coupled to a chucking power source (not shown) that, when energized, electrostatically clamps a substrate to the support surface 307. The chucking electrode 312 is embedded in a dielectric layer 314. The support assembly 305 further includes a power electrode 313 in the dielectric layer 314 separating the power electrode 313 from the substrate support surface 307 of the substrate support assembly 305. In various embodiments, the dielectric layer 314 is formed from a ceramic material as, for example, aluminum nitride (AlN) and has a thickness on the order of about 5-7 mm, though other dielectric materials and/or different layer thicknesses may be used. The substrate support assembly 305 of FIG. 3 further includes an edge ring 350 typically provided to confine plasma used in processing of a substrate or to protect a substrate from erosion by the plasma.

In various embodiments, the system 300 of FIG. 3 can comprise components of a plasma processing chamber such as the SYM3®, DPS® ENABLER®, ADVANTEDGE™ and AVATAR™ process chambers available from Applied Materials, Inc. of Santa Clara, California or other process chambers. Although in the system 300 of FIG. 3 the substrate support assembly 305 illustratively includes an electrostatic chuck 311 for supporting a substrate, the illustrated embodiment should not be considered limiting. More specifically, in other embodiments in accordance with the present principles, a substrate support assembly 305 in accordance with the present principles can include a vacuum chuck, a substrate retaining clamp, or the like (not shown) for supporting a substrate for processing.

Figure 2A:
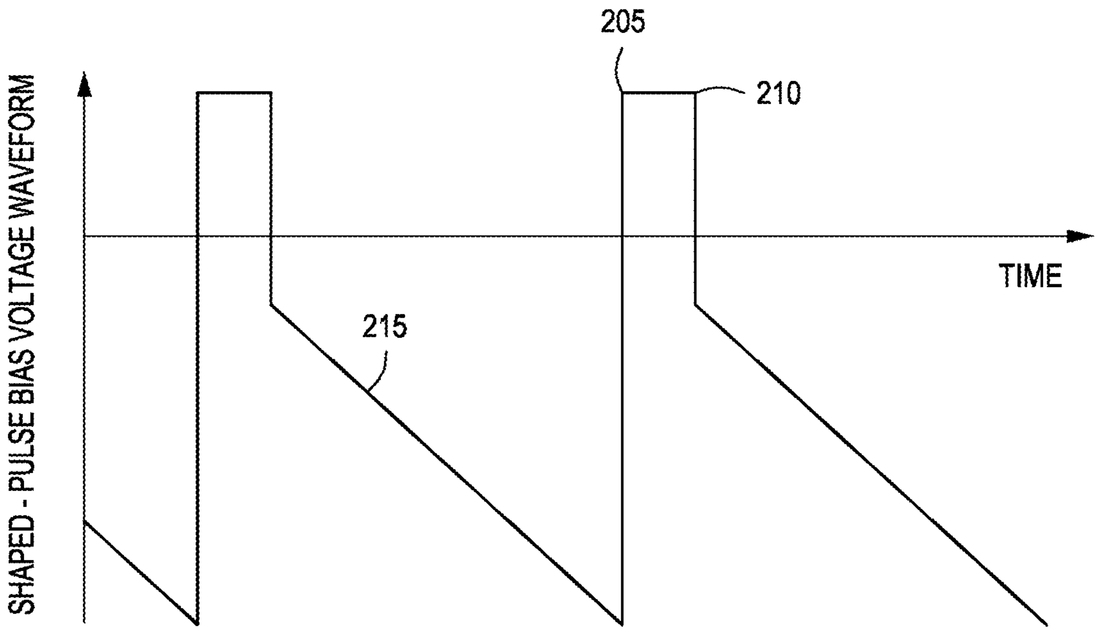
FIG. 2A depicts a plot of a previously determined special shaped-pulse bias developed to keep constant a sheath voltage of a processing chamber.
Figure 2B:
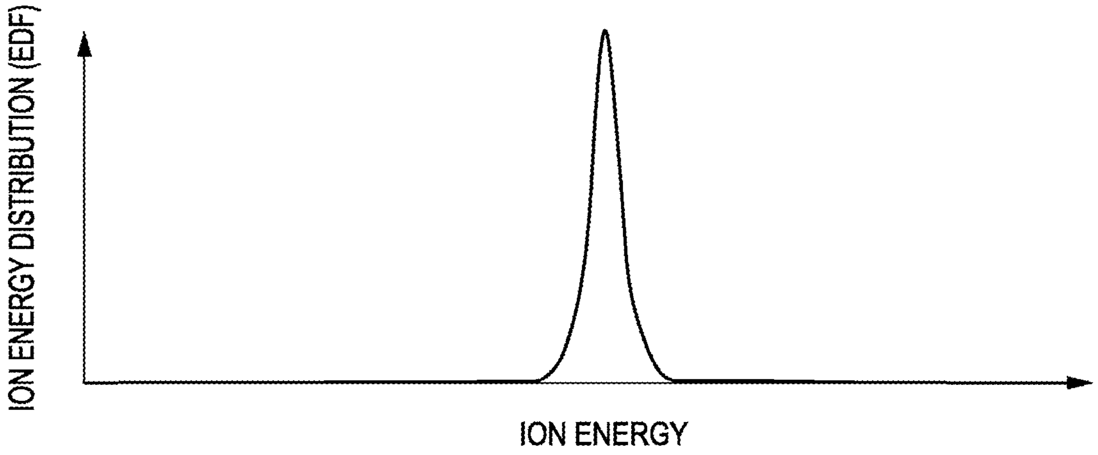
FIG. 2B depicts a plot of a single peak Ion Energy Distribution Function resulting from a special shaped-pulse bias being supplied to a processing chamber.

In operation, a substrate to be processed is positioned on a surface of the substrate support assembly 305. Referring back to FIG. 3, a voltage (e.g., a shaped-pulse bias) from the bias supply 330 is supplied to the power electrode 313. As described above, the non-linear nature of the plasma sheath results in rectification of the applied RF field, such that a direct-current (DC) voltage drop, or "self-bias", appears between the cathode and the plasma. This voltage drop determines the average energy of the plasma ions accelerated towards the cathode. Ion directionality and the feature profile are controlled by the Ion Energy Distribution Function (IEDF), which should have a well-controlled, single-peak (FIG. 2B). To provide such a single-peak IEDF, the bias supply 330 supplies a special shaped pulse bias (see FIG. 2A) to the power electrode 313 that results in the applied voltage being divided between the chuck and the sheath capacitances, to compensate for ion current constantly charging the surface of the cathode 311. The special shaped pulse bias enables the sheath voltage to remain constant for up to 90% of the pulse cycle.

However, for the special shaped pulse bias to function as intended, currently several capacitance values must be either known or estimated with a degree of precision that may be exceedingly difficult to achieve. In particular, the shaped pulse bias waveform (FIG. 2A) requires that the total voltage supplied to the power electrode 313 is divided among the ESC chuck 311 and the sheath charge which forms in the space between the plasma and the ESC support surface or substrate disposed thereon (referred to as the "space charge sheath" or "sheath"). While an ESC capacitance, $C_{CK}$, can be readily ascertained, values of stray capacitance ($C_{STR}$) and sheath capacitance ($C_{SH}$) have been found to vary unpredictably with respect to time. The stray capacitance, $C_{STR}$, for example, is determined by conditions within a plasma processing chamber and, accordingly, is sensitive to such factors as thermal expansion of processing chamber components and the like.

Functionally, the ESC and sheath act as two capacitors connected in series, and since the input voltage waveform applied to one of the electrodes of the ESC capacitor is controlled, to determine how the total applied voltage will split between the capacitors and how much voltage there will be on the sheath, both capacitance values need to be known.

As such, the ability to obtain an accurate estimation of the sheath voltage drop for purposes of obtaining a shaped-pulse waveform is conditioned upon an ability to accurately determine sheath capacitance, $C_{SH}$. Sheath capacitance is a complex function of the applied voltage and plasma parameters, such as density and temperature of the species, and as such is difficult to predict analytically.

The inventors determined that the nature of the bulk plasma sustained within the processing chamber can also influence how the plasma responds to an applied pulse. For example, the density of the plasma sets the limit on the rate of charge injected into the sheath. In view of the considerations mentioned above, a proper assessment of the sheath capacitance, $C_{SH}$, must take into account at least chemical gas composition, RF source frequency and power (through plasma density and temperature), gas pressure, and the composition of a substrate to be processed. For at least the reasons described above, the evaluation of the sheath capacitance is especially difficult, especially when it is considered that plasma conditions are never perfectly reproducible.

In accordance with various embodiments of the present principles, to overcome the deficiencies described above, the inventors propose to use a feedback signal, representative of a substrate voltage waveform, to maintain nearly constant ion energy during the processing of the substrate. The inventors determined that because plasma potential is quite low and is nearly constant, a good estimation of the sheath voltage can be represented by the negative jump in the pulsed voltage waveform at the substrate. More accurately, the substrate voltage waveform nearly reproduces the sheath voltage waveform, but substrate voltage waveform has a positive dc offset equal to the plasma potential. As such, in some embodiments in accordance with the present principles, the inventors propose to monitor a signal representative of the voltage at a substrate during processing of the substrate and to communicate a signal representative of the voltage at the substrate to the digitizer/controller 320. The digitizer/controller 320 in turn determines and communicates correction signals to the bias supply 330 to adjust the shaped-pulse bias provided by the bias supply 330 to the power electrode 313 such that a sheath voltage, represented by the voltage at the substrate, remains constant for up to 90% of the shaped-pulse bias cycle (during the ion current compensation phase following the negative voltage jump), and/or within a tolerance of a predetermined voltage level. The inventors determined that in various embodiments, the ion energy or sheath voltage can be kept constant within a noise level, and in one embodiment, the ion energy or sheath voltage can be maintained within 1-5 percent of a predetermined level, to be considered constant.

Figure 4:
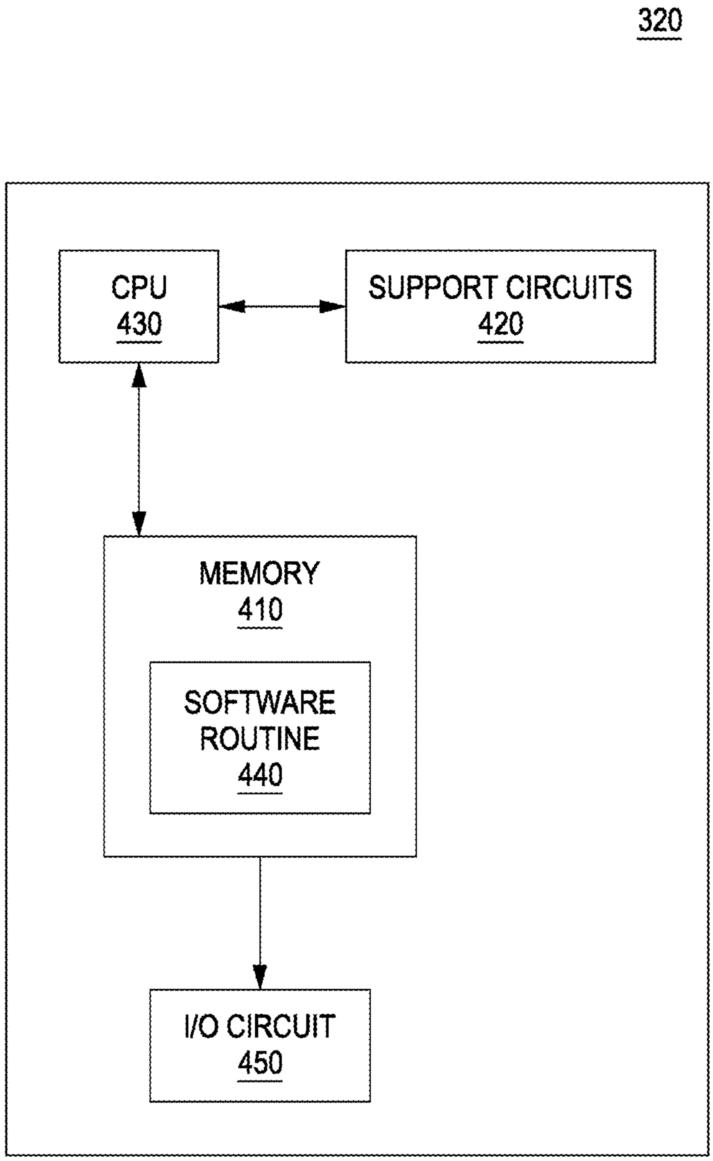
FIG. 4 depicts a high level block diagram of a digitizer/controller suitable for use in the system of FIG. 3 in accordance with one embodiment of the present principles.

FIG. 4 depicts a high level block diagram of a digitizer/controller 320 suitable for use in the system 300 of FIG. 3. The digitizer/controller 320 of FIG. 4, illustratively comprises a general-purpose computer processor that can be used in an industrial setting for controlling a plasma process in accordance with the present principles. The memory, or computer-readable medium 410 of the digitizer/controller 320 may be one or more of readily available memory such as random access memory (RAM), read only memory (ROM), floppy disk, hard disk, or any other form of digital storage, local or remote. The support circuits 420 are coupled to the CPU 430 for supporting the processor in a conventional manner. These circuits include cache, power supplies, clock circuits, input/output circuitry and subsystems, and the like.

In various embodiments, the inventive methods disclosed herein may generally be stored in the memory 410 as a software routine 440 that, when executed by the CPU 430 as assisted by the I/O circuit 450, causes the process digitizer/controller 320 to perform processes of the present principles. The software routine 440 may also be stored and/or executed by a second CPU (not shown) that is remotely located from the hardware being controlled by the CPU 430. Some or all of the method of the present disclosure may also be performed in hardware. As such, the disclosure may be implemented in software and executed using a computer system, in hardware as, for example, an application specific integrated circuit or other type of hardware implementation, or as a combination of software and hardware. The software routine 440, when executed by the CPU 430, transforms the general purpose computer into a specific purpose computer (digitizer/controller) 320 that controls a plasma processing chamber such that the methods disclosed herein are performed.

In one embodiment in accordance with the present principles and with reference back to FIG. 3, to capture a signal representative of the voltage at a substrate being processed, an optional conductive lead (e.g., a wire) 352 can be provided in the substrate support assembly 305 of FIG. 3. The optional conductive lead 352 in the substrate support assembly 305 is configured such that when a substrate to be processed is positioned on the support pedestal 310, the conductive lead 352 makes contact with at least a portion (e.g., back) of the substrate. The conductive lead 352 can be used to communicate to the digitizer/controller 320, a signal representative of a voltage captured at the substrate during processing.

The digitizer/controller 320 evaluates the received signal from the conductive lead 352 and, if the voltage at the substrate has changed and/or is not within a tolerance of a predetermined voltage level, the digitizer/controller 320 determines a control signal to be communicated to the bias supply 330 to cause the bias supply to adjust the voltage being provided by the bias supply 330 to the power electrode 313 to cause the voltage at the substrate to remain constant and/or within a tolerance of a predetermined voltage level.

Figure 7:
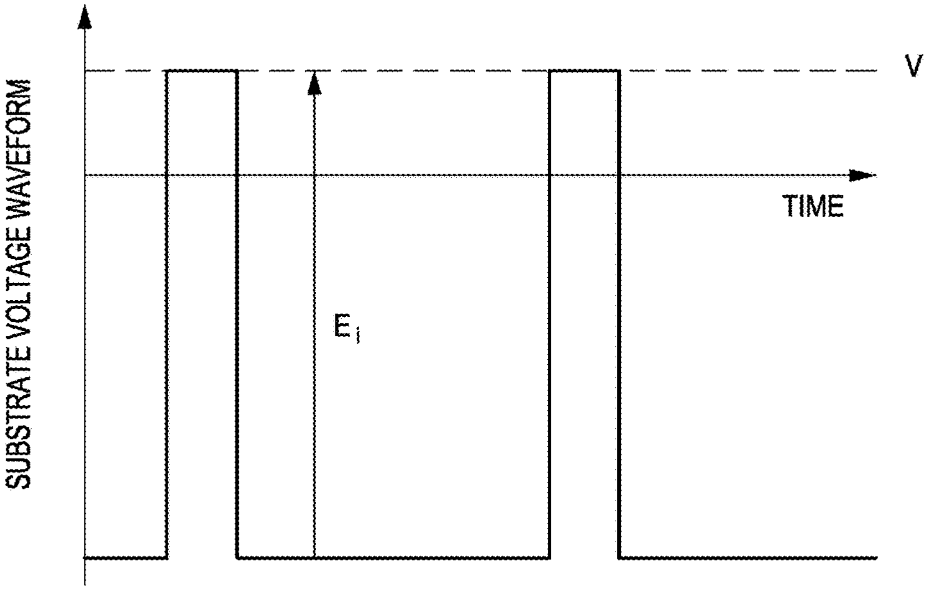
FIG. 7 depicts a graphical representation of a resultant voltage waveform at a substrate maintained in accordance with an embodiment of the present principles.

For example, FIG. 7 depicts a graphical representation of a resultant voltage waveform at a substrate maintained in accordance with an embodiment of the present principles. As depicted in the embodiment of FIG. 7, a voltage waveform at a substrate during, for example, a plasma etching process can be maintained constant over time in accordance with the present principles. That is, as depicted in FIG. 7, the ion energy is maintained constant during the processing of the substrate in accordance with embodiments of the present principles described herein.

In one embodiment, the digitizer/controller 320 implements an iterative process to determine a control signal to communicate to the bias supply. For example, in one embodiment, upon determining that the voltage received requires adjustment, the digitizer/controller 320 communicates a signal to the bias supply 330 to cause an adjustment in the voltage being supplied by the bias supply 330 to the power electrode 313. After the adjustment, the voltage at the substrate is again evaluated by the digitizer/controller 320. If the voltage captured at the substrate has become more constant or closer to the tolerance of the predetermined voltage level, but still requires more adjustment, the digitizer/controller 320 communicates another control signal to the bias supply 330 to cause an adjustment to the voltage being supplied by the bias supply 330 to the power electrode 313 in the same direction. If, after adjustment, the voltage captured at the substrate has become less constant or farther from the predetermined voltage level, the digitizer/controller 320 communicates another control signal to the bias supply 330 to cause an adjustment to the voltage being supplied by the bias supply 330 to the power electrode 313 in the opposite direction. Such adjustments can continue to be made until the voltage at the substrate remains constant and/or within a tolerance of a predetermined voltage level. In one embodiment, the digitizer/controller 320 digitizes the voltage signal from the conductive lead 352 and communicates the digitized voltage signal to the bias supply to periodically adjust the shaped pulse bias waveform so that the substrate voltage remains constant and/or within a tolerance of a predetermined voltage level.

In other embodiments in accordance with the present principles, a signal representative of the voltage at a substrate being processed can be captured using the edge ring 350 of the substrate support assembly 305 of FIG. 3. For example, in one embodiment and with reference back to FIG. 3, in the system 300 the edge ring 350 is used to sense voltage measurements representative of a voltage at a substrate being processed. In one embodiment in accordance with the present principles, the edge ring 350 is located directly above the power electrode 313 and is large enough to overlap the edges of the power electrode 313. In some embodiments, the edge ring 350 includes an annular layer of conductive material 371 disposed on an annular layer of dielectric material 373 and is dimensioned and arranged for capacitive coupling between one or both of the power electrode 313 and/or the substrate itself. In some embodiments, the edge ring 350 comprises an underlying layer of quartz, and a layer of heavily doped silicon carbide. Because of the composition and location of the edge ring 350, the edge ring 350 can be electrically or capacitively coupled to a substrate being processed so as to sense a signal representative of the voltage at the substrate being processed which is within, for example, 5 to 7 percent of the actual voltage at the substrate.

This was determined experimentally by the inventors by placing a metal wafer, acting as a substrate being processed, on the ESC 311 and measuring the voltage at the metal wafer and comparing the voltage measurements at the metal wafer with voltage measurements taken using an edge ring 350 during the same conditions. The measurements were within 5 to 7 percent.

Figure 5:
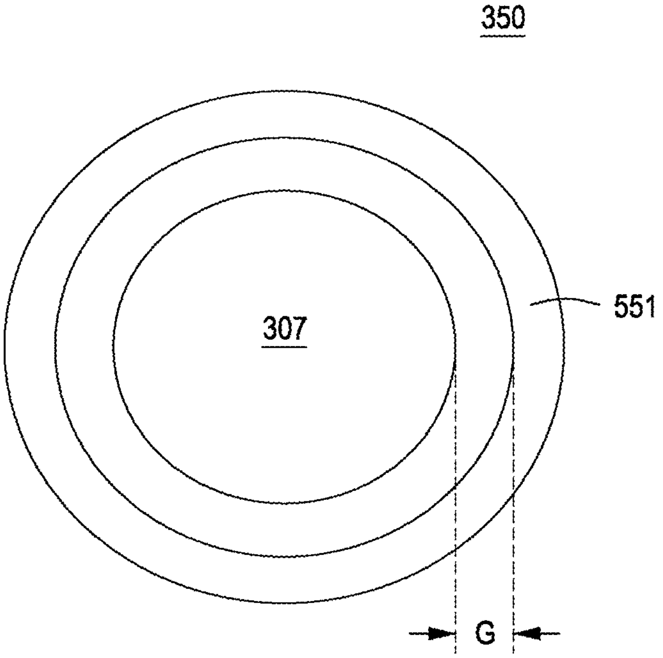
FIG. 5 depicts a plan view of an edge ring suitable for use in the system of FIG. 3 in accordance with an embodiment of the present principles.

FIG. 5 depicts a plan view of an edge ring 350 suitable for use in the system 300 of FIG. 3 in accordance with an embodiment of the present principles. In the embodiment of FIG. 5, the edge ring 350 illustratively circumscribes the substrate support surface 307 of the substrate support assembly 305. The edge ring 350 illustratively includes an annular layer of conductive material 551. The edge ring 350 can optionally further include an annular layer of dielectric material (not shown) on which the annular layer of conductive material 551 is disposed. As depicted in FIG. 5, there is a small gap, indicated at G, between the outer peripheral edge of the substrate support dielectric layer and/or the outer peripheral edge of the substrate (not shown) and the inner peripheral edge surface(s) of the conductive layer 551 of the edge ring 350 and, optionally, the underlying dielectric layer (not shown). As such, any coupling between the edge ring 350 and a substrate to be processed is capacitive rather than galvanic.

In such an embodiment and with reference back to FIG. 3, an optional conductive lead 353 is configured to make contact with at least a portion (e.g., back) of the edge ring 350. The conductive lead 353 can be used to communicate to the digitizer/controller 320, a signal representative of the voltage at the substrate during processing, which is electrically and/or capacitively sensed by the edge ring 350.

The digitizer/controller 320 evaluates the received signal indicative of the voltage at the substrate from the edge ring 350 and, if the voltage has changed and/or is not within a tolerance of a predetermined voltage level, the digitizer/controller 320 communicates a control signal to the pulse bias supply 330 to cause the pulse bias supply to adjust the voltage being provided by the bias supply 330 to the power electrode 313 to cause the voltage at the substrate being processed to remain constant and/or within a tolerance of a predetermined voltage level as described above.

In other embodiments in accordance with the present principles and as described above, the voltage at a substrate being processed or the sensed voltage at an edge ring can be captured by providing an electrical or capacitive coupling circuit (not shown) instead of using a conductive lead. In such embodiments, a conductive lead (e.g., conductive leads 352, 353) does not have to be in contact with a substrate being processed or the edge ring 350 to capture the respective voltage signals. Instead, an electrical or capacitive coupling circuit (not shown) can be used to capture a signal representative of the voltage at a substrate directly from a substrate being processed or, alternatively or additionally, a signal representative of the voltage at the substrate capture from an edge ring electrically or capacitively sensing the voltage at the substrate being processed. In such embodiments, a conductive lead can be used to communicate the respective signals from the respective coupling circuits to the digitizer/controller 320 as described above.

Figure 6:
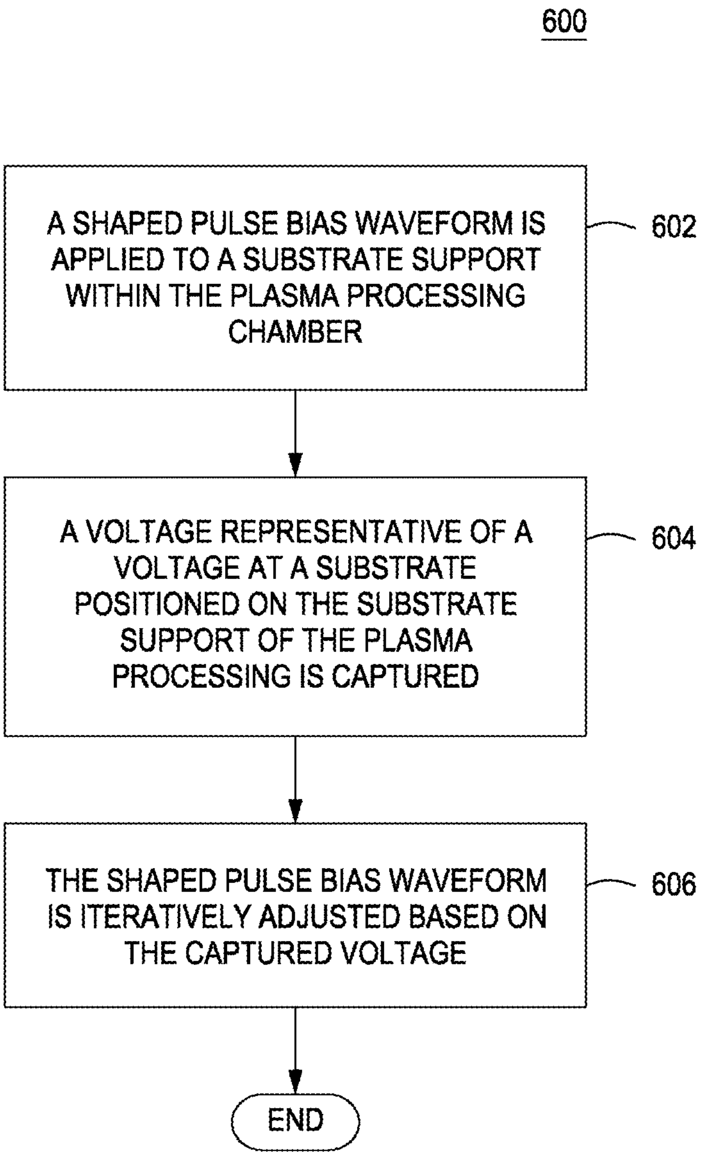
FIG. 6 depicts a functional block diagram of a method for controlling a plasma process in accordance with an embodiment of the present principles.

FIG. 6 depicts a functional block diagram of a method 600 for controlling a voltage waveform at a substrate during plasma processing in accordance with an embodiment of the present principles. The process can begin at 602 during which a shaped pulse bias waveform is applied to a substrate support within the plasma processing chamber. As described above, in one embodiment in accordance with the present principles, the shaped pulse bias waveform is applied to the power electrode of a substrate support assembly. The process 600 can then proceed to 604.

At 604, a signal representative of a voltage at a substrate positioned on the substrate support assembly of the plasma processing chamber is captured. As described above, in one embodiment, the voltage at a substrate being processed is captured using a conductive lead touching a portion of the substrate being processed. In other embodiments and as described above, an edge ring senses, via for example electrical and or capacitive coupling, a signal representative of a voltage at a substrate being processed. A conductive lead touching a portion of the edge ring captures a signal representative of a voltage at the substrate being processed. The process 600 can then proceed to 606.

At 606, the shaped pulse bias waveform is iteratively adjusted based on the captured signal. As described above, in one embodiment the captured signal representative of the voltage at the substrate being processed is communicated to a digitizer/controller. The digitizer/controller iteratively adjusts the shaped pulse bias waveform applied by the bias supply to, for example, the power electrode by providing a control signal to the bias supply, in response to a received voltage signal, to cause the bias supply to adjust a bias waveform such that the voltage at the substrate remains constant and/or within a tolerance of a predetermined voltage level. The process 600 can then be exited.

In accordance with other embodiments of the present principles, to overcome the need for complex modeling or precise estimation of plasma sheath capacitance, $C_{SH}$, and chamber stray capacitance, $C_{STR}$, the inventors propose: (1) rendering a change in the voltage drop attributable to the chuck capacitance, $C_{CK}$, negligible by comparison with the change in the voltage drop attributable to the sheath capacitance, $C_{SH}$, during the negative jump (sheath formation) phase of the bias and substrate voltage waveforms, and (2) rendering the current through Cstr negligible by comparison with the current through $C_{CK}$ during the ion current compensation phase of the bias voltage waveform. This is accomplished by making a capacitance between a power electrode and a substrate much greater than sheath and stray capacitances, thus alleviating the requirement of the accurate determination. Because the change in the voltage drop across $C_{CK}$ is negligible compared to that across $C_{SH}$ during the negative jump phase of the bias and substrate voltage waveforms, the negative jump in the pulsed voltage waveform of the signal applied to the power electrode (i.e. bias voltage waveform) is approximately equal to the negative jump in the substrate voltage waveform (i.e. the value of the sheath voltage drop and mean ion energy). Thus, accurate determination of $C_{SH}$ is not required in order to set the value of the negative jump in the bias voltage waveform that results in the target value of the sheath voltage drop. Furthermore, because the current through $C_{STR}$ is much smaller than the current through $C_{CK}$ during the ion current compensation phase, the total current through the shaped-pulse bias supply, substrate current, Is, is approximately equal to the current through $C_{CK}$ (equal to the ion current, li, to the substrate). Thus, accurate determination of $C_{STR}$ is not required to set the slope of the bias voltage ramp during the ion current compensation phase that results in a constant substrate voltage during this time. This slope, which is always equal to $Is/(C_{CK}+C_{STR})$, is approximately equal to $Is/C_{CK}$, if $C_{CK}>>C_{STR}$. In one embodiment in accordance with the present principles, the composition and thickness of a dielectric layer between the power electrode and the surface of the substrate support are selected such that the chuck capacitance, $C_{CK}$, of the dielectric layer between the power electrode and the surface of the substrate support is very large (i.e., at least an order of magnitude larger) relative to stray capacitance, $C_{STR}$, and sheath capacitance, $C_{SH}$. For example and with reference back to FIG. 3, the ceramic thickness between the power electrode 313 and the surface of the substrate support can be selected to be approximately 0.3 mm, with the shaped-pulsed bias applied to the power electrode. Alternatively, the ceramic thickness between the chucking electrode 312 and the substrate support surface 307 can be selected to be approximately 0.3 mm, with the shaped-pulsed bias applied to the chucking electrode.

In order for the shape of the bias voltage waveform to reproduce the shape of the substrate voltage waveform not only during sheath formation (negative jump, $V_{OUT}$) phase, but also during the ion current compensation phase, the change in the voltage drop across $C_{CK}$ due to ion current needs to be negligible compared to the bias voltage negative jump, $V_{OUT}$. Because the substrate voltage remains constant during this phase, the rate of change of the voltage drop across $C_{CK}$ is equal to the rate of bias voltage change required to compensate for the ion current, and is equal to $I_i/C_{CK}$, or approximately equal to $Is/C_{CK}$, if $C_{CK}>>C_{STR}$. As such, a total bias voltage change during the ion current compensation phase of a bias voltage waveform is equal to $I_i*T/C_{CK}$, where T is the duration of the ion current compensation phase. If $I_i*T/C_{CK}$ is much smaller than $V_{OUT}$, where $V_{OUT}$ is the negative jump in the bias voltage waveform, the voltage ramp during the compensation phase of the bias voltage waveform is negligible, simplifying the pulse shape requirement. In such embodiments, it is not necessary to satisfy the condition $C_{CK}>>C_{STR}$, because the shape of the pulsed voltage waveform of the signal applied to the power electrode (i.e. bias voltage waveform) fully reproduces the shape of the substrate voltage waveform and can be used as a feedback signal to maintain the predetermined (nearly constant) substrate voltage waveform during the ion current compensation phase, as described in some embodiments above.

In another embodiment in accordance with the present principles, to satisfy conditions (1) and (2) in paragraph above by rendering the sheath capacitance, $C_{SH}$, and the stray capacitance, $C_{STR}$, negligible by comparison with the chuck capacitance, $C_{CK}$, a voltage from a bias supply is supplied to a chucking pole (e.g., a metal baseplate or mesh embedded in the electrostatic chuck) instead of to a power electrode.

For example and with reference back to the system 300 of FIG. 3, in an embodiment in accordance with the present principles, to render a voltage drop attributable to the chuck capacitance, $C_{CK}$, negligible by comparison to the voltage drop attributable to the sheath capacitance, $C_{SH}$, a voltage (bias) from the bias supply 330 is applied to the chucking electrode 312 of the electrostatic chuck 311 instead of the power electrode 313. By applying a bias, such as the special waveform bias (FIG. 2A), to the chucking electrode 312 instead of to the power electrode 313, the voltage drop across the chuck capacitance is so small that the voltage amplitude measurable at the substrate surface, at any time during the application of the bias pulse substantially approximates the voltage amplitude of the pulse (i.e., does not vary more than 0 to 5%).

In such embodiments, it is important to maintain a difference between a ceramic thickness between a chucking electrode and a substrate support surface at least an order of magnitude smaller than a ceramic thickness between a power electrode and the substrate support surface. For example and with reference back to the system 300 of FIG. 3, in one embodiment in which the dielectric layer 314 comprises aluminum nitride, the ceramic thickness between the chucking electrode 312 and the substrate support surface 307 can be approximately 0.3 mm, while the ceramic thickness between the power electrode 313 and wafer can be approximately 3-5 mm. Therefore, the capacitance is increased by at least an order of 10. That is, the value of the chuck capacitance, $C_{CK}$, is many times greater (on the order of 10×, 20×, or more times greater) than stray capacitance and sheath capacitance, $C_{SH}$.

Figure 8:
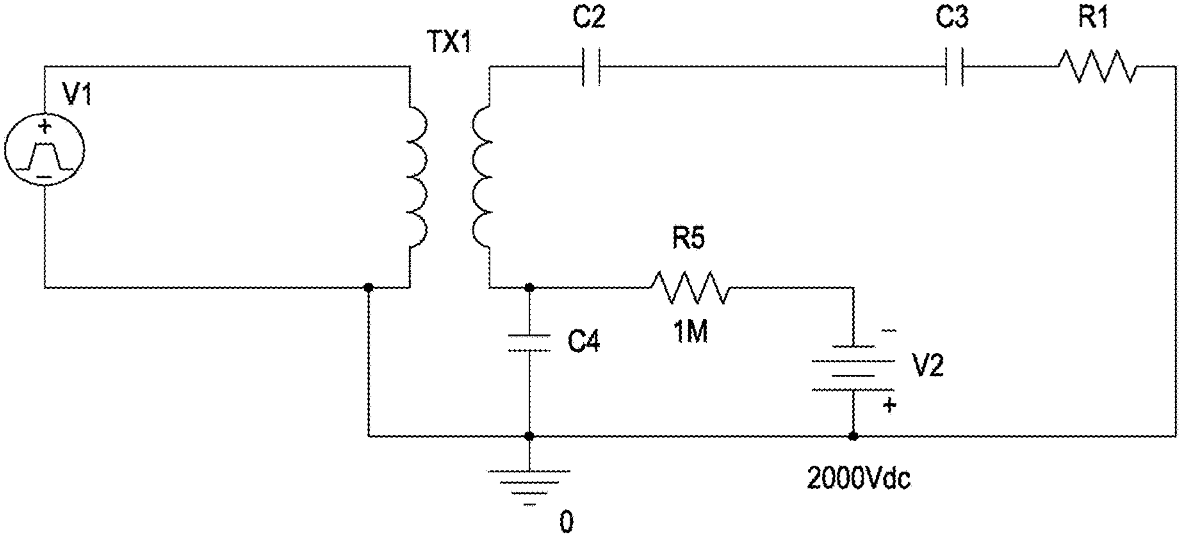
FIG. 8 depicts a schematic diagram of a transformer coupling circuit for coupling a clamping voltage and bias voltage to a chucking pole in accordance with an embodiment of the present principles.
Figure 9A:
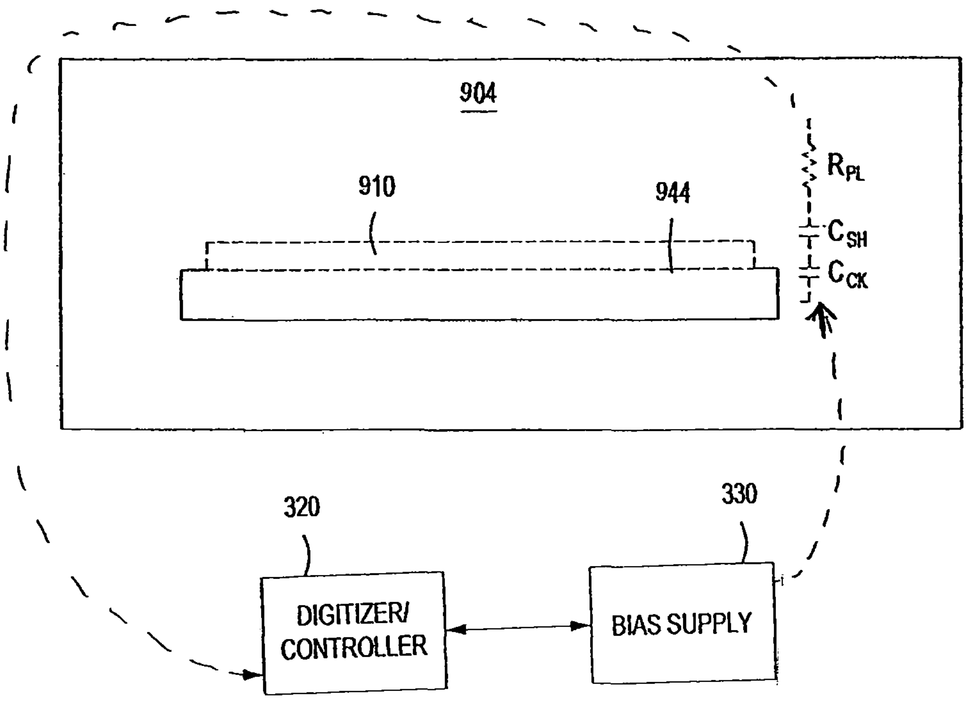
Figure 9B:
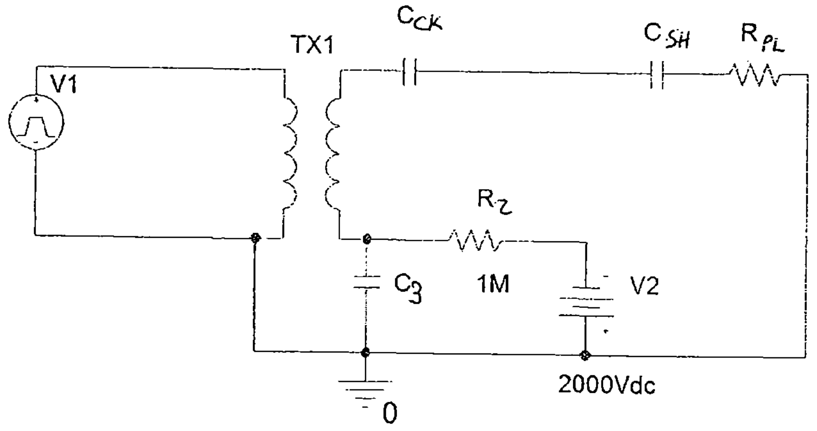

In embodiments of a plasma processing system in which a bias voltage is supplied to a chucking pole in accordance with the present principles, it should be taken into account that a DC clamping voltage, on the order of −2 kV, is typically also provided to a chucking pole. Because the clamping current required is extremely small, in some embodiments the inventors propose isolating the high voltage DC supply with a large resistor (e.g., 1M ohm) with a capacitor. The bias (e.g., pulse-shaped waveform) can be coupled to the chucking pole using a blocking capacitor or pulse transformer. For example, FIG. 8 depicts a schematic diagram of a transformer coupling circuit 800 for coupling a clamping voltage and bias voltage to a chucking pole in accordance with an embodiment of the present principles. The transformer coupling circuit 800 of FIG. 8 illustratively comprises a voltage bias source 802, a clamping voltage source 804, two resistors, R1 and R5, and three capacitors, C2, C3 and C4. That is, FIG. 8 depicts an example of a circuit enabling a chucking pole to be used for application of both, a shaped-pulsed bias and chucking voltages, simultaneously. In other embodiments (not shown), the bias and clamping power sources can be combined into to one power source that can output a desired summed waveform. Referring back to FIG. 3, FIG. 3 further depicts a positioning of the coupling circuit of FIG. 8 in relation to the substrate support assembly 305 in accordance with an embodiment of the present principles. As depicted in FIG. 3, a voltage bias V1, a clamping voltage V2, an isolating resistor R5 and a block capacitor C4, and a pulse transformer TX1 of the coupling circuit can be provided by the bias supply 330. In FIG. 3, R1 represents the resistive load of the plasma, C2 represents the chuck capacitance and C3 represents the sheath capacitance.

The above described embodiments in accordance with the present principles are not mutually exclusive. More specifically, in one embodiment the chuck capacitance, $C_{CK}$, of a substrate support pedestal in accordance with the present principles can be made substantially larger than the sheath capacitance, $C_{SH}$, as described above and a signal representative of a sheath voltage can be used as a feedback signal to adjust a shaped pulse bias waveform provided by the bias supply such that the signal representative of the sheath voltage remains constant during the ion current compensation phase and/or within a tolerance of a predetermined voltage level.

In one such embodiment, a shaped pulse bias waveform from a bias supply is provided to a metal baseplate or mesh of an electrostatic chuck of a substrate support pedestal in accordance with the present principles. A voltage at a substrate being processed is then captured and communicated to a controller. The controller determines a control signal to communicate to the bias supply to adjust the shaped pulse bias waveform provided by the bias supply to the metal baseplate or mesh of the electrostatic chuck such that the voltage captured at the substrate remains constant during the ion current compensation phase and/or within a tolerance of a predetermined voltage level.

In another such embodiment, the thickness and composition of the layer of dielectric material separating the power electrode from a surface of the substrate support are selected such that the capacitance of the dielectric layer (chuck capacitance) is very large relative to stray capacitance and sheath capacitance. A voltage at an edge ring surrounding a substrate being processed is then captured and communicated to a controller. The controller determines a control signal to communicate to the bias supply to adjust a shaped pulse bias waveform provided by the bias supply to a power electrode of the substrate support such that the voltage captured at the substrate remains constant during the ion current compensation phase and/or within a tolerance of a predetermined voltage level.

In another such embodiment, the thickness and composition of the layer of dielectric material separating the power electrode from a surface of the substrate support are selected such that the capacitance of the dielectric layer (chuck capacitance) is very large relative to stray capacitance and sheath capacitance as described above. A voltage at a substrate being processed is then captured and communicated to a controller. The controller determines a control signal to communicate to the bias supply to adjust a shaped pulse bias waveform provided by the bias supply to a power electrode of the substrate support pedestal such that the voltage captured at the substrate remains constant during the ion current compensation phase and/or within a tolerance of a predetermined voltage level.

In another such embodiment, a shaped pulse bias waveform from a bias supply is provided to a metal baseplate or mesh of an electrostatic chuck of a substrate support pedestal in accordance with the present principles. A voltage at an edge ring surrounding a substrate being processed is then captured and communicated to a controller. The controller determines a control signal to communicate to the bias supply to adjust the shaped pulse bias waveform provided by the bias supply to the metal baseplate or mesh of the electrostatic chuck such that the voltage captured at the substrate remains constant during the ion current compensation phase and/or within a tolerance of a predetermined voltage level.

While the foregoing is directed to embodiments of the present disclosure, other and further embodiments of the disclosure may be devised without departing from the basic scope thereof.

The invention claimed is:

1. A plasma processing system, comprising:

a substrate support defining a surface for supporting a substrate to be processed, the substrate support including an electrostatic chuck comprising a chucking pole, and an electrode, wherein the electrode and the chucking pole are disposed in a layer of dielectric material and are separated from the substrate support surface by respective portions of the layer of dielectric material;

a plasma, disposed above the substrate support surface;

a sensor capturing a signal representative of a voltage at a substrate positioned on the substrate support surface;

a bias supply providing a shaped pulse bias waveform to the chucking pole;

a controller receiving the captured signal from the sensor and generating a control signal to be communicated to the bias supply to adjust the shaped pulse bias waveform based on the captured signal; and wherein the chucking pole is located in the layer of dielectric material such that a thickness of a portion of the layer of dielectric material between the chucking pole and the substrate support surface is at least ten times less than a thickness of a portion of the layer of dielectric material between the electrode and the substrate support surface.

2. The plasma processing system of claim 1, further comprising a coupling circuit for coupling the shaped pulse bias waveform to the chucking pole.

3. The plasma processing system of claim 1, wherein a clamping voltage is further applied to the chucking pole.

4. The plasma processing system of claim 3, further comprising a coupling circuit for coupling the clamping voltage to the chucking pole.

5. The plasma processing system of claim 3, wherein the clamping voltage is isolated with a large resistor.

6. The plasma processing system of claim 1, wherein the dielectric material comprises aluminum nitride.

7. The plasma processing system of claim 1, wherein the chucking pole is located in the layer of dielectric material such that a thickness of a portion of the layer of dielectric material between the chucking pole and the substrate support surface is 0.3 mm or less when a thickness of a portion of the layer of dielectric material between the electrode and the substrate support surface is at least 3 mm.

8. A plasma processing system, comprising:

a substrate support defining a surface for supporting a substrate to be processed, the substrate support including an electrostatic chuck comprising a chucking pole, and an electrode, wherein the electrode and the chucking pole are disposed in a layer of dielectric material and are separated from the substrate support surface by respective portions of the layer of dielectric material;

a plasma, disposed above the substrate support surface; and a shaped pulse bias waveform generator to apply a shaped pulse bias waveform to the chucking pole, wherein the chucking pole is located in the layer of dielectric material such that a thickness of a portion of the layer of dielectric material between the chucking pole and the substrate support surface is at least ten times less than a thickness of a portion of the layer of dielectric material between the electrode and the substrate support surface.

9. The plasma processing system of claim 8, wherein the dielectric layer comprises aluminum nitride.

10. The plasma processing system of claim 8, wherein a clamping voltage is further applied to the chucking pole.

11. The plasma processing system of claim 10, wherein the clamping voltage is isolated with a large resistor.

12. The plasma processing system of claim 8, comprising a coupling circuit for coupling the shaped pulse bias waveform and a clamping voltage to the substrate support.

13. The plasma processing system of claim 8, wherein the chucking pole is located in the layer of dielectric material such that a thickness of a portion of the layer of dielectric material between the chucking pole and the substrate support surface is 0.3 mm or less when a thickness of a portion of the layer of dielectric material between the electrode and the substrate support surface is at least 3 mm.

* * * * *